(12) United States Patent
He et al.

(10) Patent No.: US 11,486,034 B2
(45) Date of Patent: Nov. 1, 2022

(54) METHOD OF PREPARING ITO CERAMIC TARGET WITH CONTROLLABLE GRAIN SIZE

(71) Applicant: Zhengzhou University, Zhengzhou (CN)

(72) Inventors: Jilin He, Zhengzhou (CN); Benshuang Sun, Zhengzhou (CN); Yongchun Shu, Zhengzhou (CN); Yang Liu, Zhengzhou (CN); Jie Chen, Zhengzhou (CN); Xueyun Zeng, Zhengzhou (CN)

(73) Assignee: ZHENGZHOU UNIVERSITY, Henan (CN)

( * ) Notice: Subject to any disclaimer, the term of this patent is extended or adjusted under 35 U.S.C. 154(b) by 414 days.

(21) Appl. No.: 15/930,912

(22) Filed: May 13, 2020

(65) Prior Publication Data

US 2021/0277513 A1 Sep. 9, 2021

(30) Foreign Application Priority Data

Mar. 6, 2020 (CN) .......................... 202010150796.4

(51) Int. Cl.
*C23C 14/34* (2006.01)
*C04B 35/457* (2006.01)
(Continued)

(52) U.S. Cl.
CPC ........ *C23C 14/3414* (2013.01); *C04B 35/457* (2013.01); *C04B 35/6261* (2013.01);
(Continued)

(58) Field of Classification Search
CPC . C04B 35/457; C04B 35/6261; C04B 35/638; C04B 35/63444; C04B 35/63426;
(Continued)

(56) References Cited

U.S. PATENT DOCUMENTS

| | | | | |
|---|---|---|---|---|
| 5,630,918 A | * | 5/1997 | Takahara | ............ C23C 14/3414 204/298.13 |
| 5,700,419 A | * | 12/1997 | Matsunaga | ........... C04B 35/457 264/657 |
| 2013/0206590 A1 | * | 8/2013 | Baluch | ................ C04B 35/6261 264/129 |

FOREIGN PATENT DOCUMENTS

| | | | |
|---|---|---|---|
| CN | 103833375 | * | 6/2014 |
| WO | WO 94/18138 | * | 8/1994 |

* cited by examiner

*Primary Examiner* — C Melissa Koslow
(74) *Attorney, Agent, or Firm* — Hauptman Ham, LLP

(57) ABSTRACT

A method of preparing an ITO ceramic target includes that: $In_2O_3$ powder with mass fraction of 90~97 and $SnO_2$ powder with mass fraction of 10~3 are ball-milled and mixed with deionized water, diluent, binder and polymer material by a sand mill to obtain an ITO ceramic slurry with a solid content between 70~80% and a viscosity between 120~300 mpa·s, with an average particle size D50 of the mixed powder controlled at 100~300 nm; the ITO ceramic slurry is shaped by a pressure grouting to obtain an ITO ceramic green body with a relative density of 58~62%; the ITO ceramic green body is put into a degreasing and sintering integrated furnace, and under a degreasing temperature of 700~800° C., the ITO ceramic target is degreased in an atmospheric oxygen atmosphere for the time set to 12~36 hours; the temperature increases from the degreasing temperature to the first sintering temperature of 1,600~1,650° C.

10 Claims, 6 Drawing Sheets

(51) Int. Cl.
*C04B 35/626* (2006.01)
*C04B 35/638* (2006.01)
*C04B 35/634* (2006.01)
*C04B 35/636* (2006.01)
*C04B 35/64* (2006.01)
*C04B 111/00* (2006.01)

(52) U.S. Cl.
CPC .......... *C04B 35/634* (2013.01); *C04B 35/636* (2013.01); *C04B 35/638* (2013.01); *C04B 35/63416* (2013.01); *C04B 35/63424* (2013.01); *C04B 35/63444* (2013.01); *C04B 35/64* (2013.01); *C04B 2111/00224* (2013.01); *C04B 2235/3286* (2013.01); *C04B 2235/3293* (2013.01); *C04B 2235/5445* (2013.01); *C04B 2235/5454* (2013.01); *C04B 2235/608* (2013.01); *C04B 2235/6562* (2013.01); *C04B 2235/6565* (2013.01); *C04B 2235/6567* (2013.01)

(58) Field of Classification Search
CPC ............ C04B 35/63416; C04B 35/636; C04B 35/634; C04B 35/64; C04B 2235/3295; C04B 2235/5445; C04B 2235/5454; C04B 2235/608; C04B 2235/6562; C04B 2235/6565; C04B 2235/6567; C04B 2235/3286
See application file for complete search history.

METHOD OF PREPARING ITO CERAMIC TARGET WITH CONTROLLABLE GRAIN SIZE

CROSS-REFERENCE TO RELATED PATENT APPLICATION

This application claims priority to and the benefit of CN 202010150796.4, filed Mar. 6, 2020, entitled "Method of Preparing ITO Ceramic Target with Controllable Grain Size," by Jilin H E et al. The entire disclosure of the above-identified application is incorporated herein by reference.

Some references, which may include patents, patent applications, and various publications, are cited and discussed in the description of the present disclosure. The citation and/or discussion of such references is provided merely to clarify the description of the present disclosure and is not an admission that any such reference is "prior art" to the present disclosure described herein. All references cited and discussed in this specification are incorporated herein by reference in their entireties and to the same extent as if each reference was individually incorporated by reference.

TECHNICAL FIELD

The present application relates to the technical field of ceramic target preparation, and specifically relates to a method of preparing an ITO ceramic target with a controllable grain size.

BACKGROUND

The ITO ceramic target is a main raw material for preparing transparent conductive oxide (TCO) on conductive glass. A layer of transparent conductive film is formed by the ITO ceramic target on the glass substrate through sputtering, and the film is processed to form a common transparent electrode. Compared with other oxide films, the ITO (Indium Tin Oxide) conductive film has the best performance, the main reason for which is that it has good conductivity (resistivity $10^{-4}$ Ω·cm), light transmittance (transmittance>85%), high ultraviolet absorption rate (absorption rate>85%), and infrared one-way penetration (reflection rate>80%).

The performance of the ITO ceramic target directly determines the quality, production efficiency and yield rate of the ITO conductive glass. In general, a high-performance ITO ceramic target should have the following properties: high purity (>99.99%), high density (relative density>99.5%), low resistivity (<0.14 mΩ·cm), large size and phase structure uniformity. In particular, the phase structure uniformity, including secondary phase ($In_4Sn_3O_{12}$ phase) distribution content and uniformity, has a significant influence on the process and performance of magnetron sputtering preparation of the ITO film. The grains of the ITO ceramic target are fine and uniform, which can reduce the nodulation phenomenon in the target sputtering process and can improve the utilization rate of the target. At the same time, it can improve the stability of the photoelectric performance of the ITO film.

At present, the commonly used sintering method of preparing the ITO ceramic target is a process that uses separate degreasing and sintering. For this sintering process, if the maximum sintering temperature is lower than 1,540° C., the ITO ceramic target cannot be fully densified, and its internal microstructure will still have many holes; whereas when its maximum sintering temperature is higher than 1,600° C., there will be such defects as coarse grains and poor uniformity.

Therefore, a heretofore unaddressed need exists in the art to address the aforementioned deficiencies and inadequacies.

SUMMARY

In order to solve at least one of the technical problems present in the technologies mentioned above, the embodiments of the present application disclose a method of preparing an ITO ceramic target with a controllable grain size. The preparation method includes the following steps that:

$In_2O_3$ powder with mass fraction of 90~97 and $SnO_2$ powder with mass fraction of 10~3 are ball-milled and mixed with deionized water, diluent, binder and polymer material by a sand mill to obtain an ITO ceramic slurry with a solid content between 70~80% and a viscosity between 120~300 mPa·s, and the average particle size D50 of the mixed powder in the ITO ceramic slurry is controlled at 200~300 nm;

ITO ceramic slurry is shaped by pressure grouting to obtain an ITO ceramic green body with a relative density of 58~62%;

The ITO ceramic green body undergoes an integrated degreasing and sintering treatment to obtain the ITO ceramic target; wherein, the integrated degreasing and sintering treatment specifically includes:

Putting the ITO ceramic green body into a degreasing and sintering integrated furnace;

Heating the degreasing and sintering integrated furnace to a degreasing temperature of 700~800° C., and degreasing the ITO ceramic target in an atmospheric oxygen atmosphere for a degreasing time set to 12 to 36 hours;

Increasing the temperature of the degreasing and sintering integrated furnace from the degreasing temperature to a first sintering temperature of 1,600~1,650° C.;

After heating up to the first sintering temperature, keeping temperature at the first sintering temperature for 0~60 min, then starting to reduce the degreasing and sintering integrated furnace from the first sintering temperature to a second sintering temperature of 1,500~1,540° C., and sintering the ITO target at the second sintering temperature in the atmospheric oxygen atmosphere with temperature kept for 12 to 36 hours, to finally obtain the ITO ceramic target.

In the method of preparing an ITO ceramic target with a controllable grain size disclosed by some embodiments, the mass fractions of $In_2O_3$ powder and $SnO_2$ powder are 90 and 10.

In the method of preparing an ITO ceramic target with a controllable grain size disclosed by some embodiments, the mass fractions of $In_2O_3$ powder and $SnO_2$ powder are 95 and 5.

In the method of preparing an ITO ceramic target with a controllable grain size disclosed by some embodiments, the mass fractions of $In_2O_3$ powder and $SnO_2$ powder are 93 and 7.

In the method of preparing an ITO ceramic target with a controllable grain size disclosed by some embodiments, the primary particle size distribution range of $In_2O_3$ powder is 80—200 nm, and the primary particle size distribution range of $SnO_2$ powder is 80~200 nm.

In the method of preparing an ITO ceramic target with a controllable grain size disclosed by some embodiments, the diluent includes polyacrylic or polycarboxylic acid diluent, the binder includes gum arabic, polyvinyl alcohol or acrylic resin, and the polymer material includes polyacrylamide.

In the method of preparing an ITO ceramic target with a controllable grain size disclosed by some embodiments, the $In_2O_3$ powder and the $SnO_2$ powder are ball-milled and mixed with deionized water, diluent, binder and polymer material by a sand mill under vacuum depressurized conditions, with the negative pressure not greater than 9 Pa.

In the method of preparing an ITO ceramic target with a controllable grain size disclosed by some embodiments, the heating rate from the room temperature to the degreasing temperature is set to 1~3° C./min.

In the method of preparing an ITO ceramic target with a controllable grain size disclosed by some embodiments, the heating rate from the degreasing temperature to the first sintering temperature is set to 2~5° C./min.

In the method of preparing an ITO ceramic target with a controllable grain size disclosed by some embodiments, the cooling rate from the first sintering temperature to the second sintering temperature is set to 8~16° C./min.

The method of preparing an ITO ceramic target with a controllable grain size disclosed by the embodiments of the present application conducts innovative research from such aspects as the primary particle size distribution of powder, ball-milled dispersion particle size distribution of mixed powder, synergistically optimized combination of shaping process and sintering process, and ITO ceramic target crystal structure. An ITO ceramic target with a controlled grain size is prepared and obtained with excellent electrical and mechanical properties, which are conducive to the preparation of high-quality ITO films. The process is easy to operate, and the green body has a good sinterability for ease to prepare ITO ceramic targets of various sizes, which have high density, low resistivity, fine grains, and uniform particle size distribution. The relative density can reach 99.7%, the resistivity is as low as 0.13 mΩ·m, and the grain size can be controlled with values thereof as low as 3~5 μm. The reduced sintering temperature can correspondingly reduce the production cost, extend the service life of the equipment, and is suitable for industrial production.

BRIEF DESCRIPTION OF THE DRAWINGS

The accompanying drawings illustrate one or more embodiments of the present invention and, together with the written description, serve to explain the principles of the invention. Wherever possible, the same reference numbers are used throughout the drawings to refer to the same or like elements of an embodiment.

DETAILED DESCRIPTION

Figure 1:
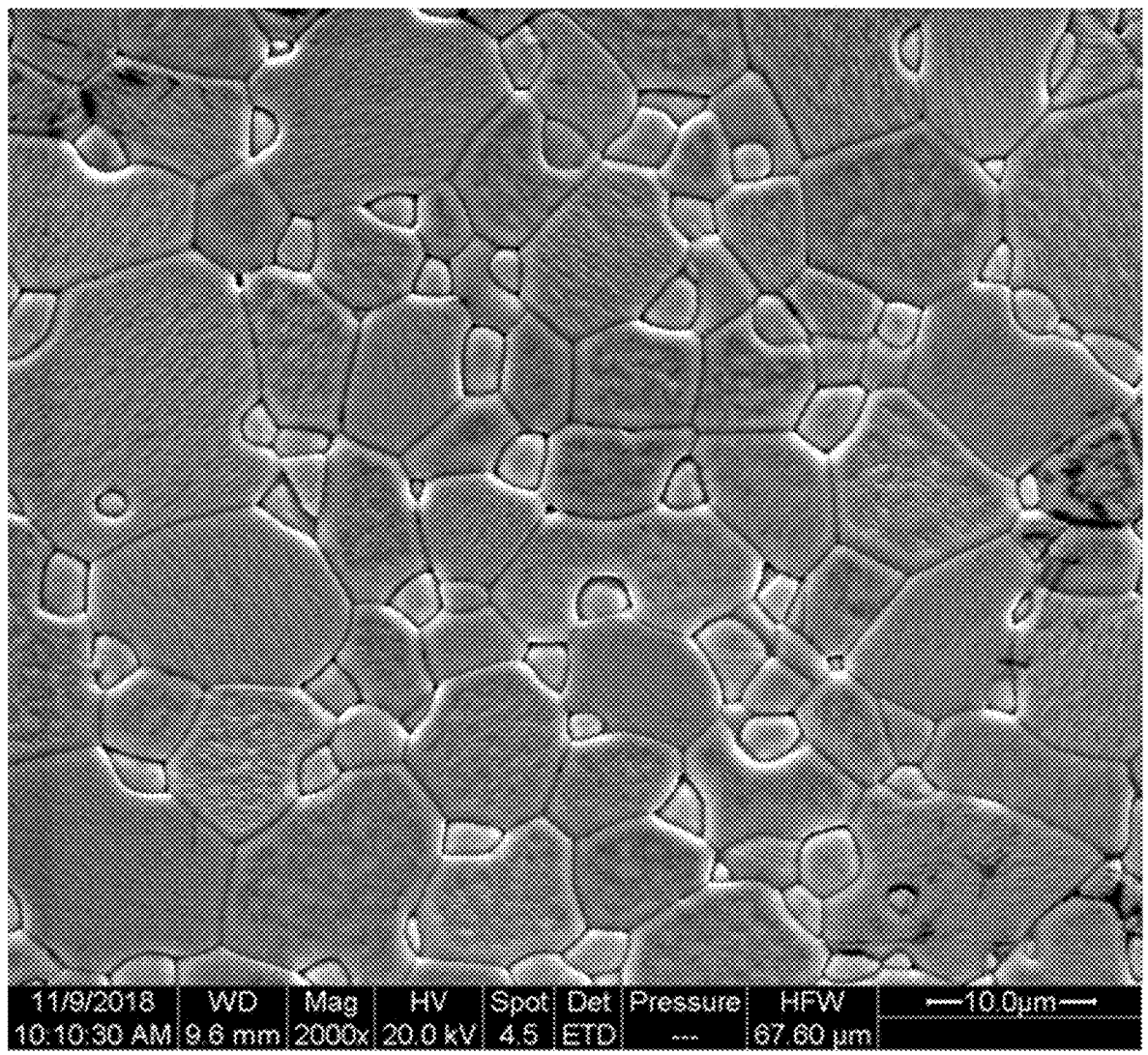
FIG. 1 is a scanning electron micrograph of the ITO ceramic target in embodiment 1.

The present invention will now be described more fully hereinafter with reference to the accompanying drawings, in which exemplary embodiments of the present invention are shown. The present invention may, however, be embodied in many different forms and should not be construed as limited to the embodiments set forth herein. Rather, these embodiments are provided so that this disclosure is thorough and complete, and will fully convey the scope of the invention to those skilled in the art. Like reference numerals refer to like elements throughout.

The term "embodiment" is used exclusively herein. Any embodiment described as "exemplary" need not be construed as superior to or better than other embodiments. Unless otherwise specified, the performance index tests in the embodiments of the present application adopt conventional test methods in the art. It should be understood that the terms stated in this application are merely used to describe specific embodiments and are not intended to limit the content disclosed in this application.

Unless otherwise stated, the technical and scientific terms used herein have the same meaning as commonly understood by those having ordinary skill in the art; other test methods and technical means unspecified in this application all refer to the experimental methods and technical means commonly adopted by those having ordinary skill in the art.

The terms "substantially" and "approximately" as used in this disclosure are used to describe small fluctuations. For example, they can mean less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%. Concentration, amount, and other numerical data can be expressed or presented in a range format in this text. Such a range format is used for convenience and brevity only, and therefore should be flexibly interpreted to include not only the numerical values explicitly listed as the limits of the range, but also all independent numerical values or sub-ranges included in the range. For example, the numerical range of "1~5%" should be interpreted to include not only the explicitly enumerated values of 1% to 5%, but also independent values and sub-ranges within the shown range. Therefore, independent values such as 2%, 3.5%, and 4%, and sub-ranges such as 1%~3%, 2%~4%, and 3%~5%, etc. are included in this numerical range. This principle also applies to a range that enumerates only one value. In addition, regardless of the width of the range or the features described, such an explanation is always applicable.

In this disclosure including the claims, all conjunctions, such as "including", "comprising", "with", "having", "containing", "involving", "accommodating", etc. are understood to be open, i.e., they mean "including but not limited to". Only the conjunctions "consisting of" and "comprised of" are closed conjunctions.

In order to better explain the content of the present application, numerous specific details are given in the specific embodiments below. Those skilled in the art should understand that this application can still be implemented in the absence of certain specific details. In the embodiments, some methods, means, instruments, equipment, etc. that are well-known to those skilled in the art, are not described in detail in order to highlight the gist of the present application. On the premise of no confliction, the technical features disclosed in the embodiments of the present application can be combined arbitrarily, and the obtained technical solution belongs to the content disclosed by the embodiments of the present application.

In some embodiments, the method of preparing an ITO ceramic target with a controlled grain size includes the following steps:

A slurry preparation step, this is, $In_2O_3$ powder with mass fraction of 90~97 and $SnO_2$ powder with mass fraction of 10~3 are ball-milled and mixed with deionized water, diluent, binder and polymer material by a sand mill to obtain an ITO ceramic slurry with a solid content between 70~80% and a viscosity between 120~300 mPa·s. The average particle size D50 of the mixed powder in the ITO ceramic slurry is controlled at 200~300 nm. The mixed powder mentioned in this application refers to a powder mixture including $In_2O_3$ powder and $SnO_2$ powder; controlling the particle size of the mixed powder greatly affects the performance of the product. Especially the average particle size of the mixed powder is closely related to the grain size control of the ITO ceramic target. The average particle size D50 being controlled between 200~300 nm can achieve ideal results;

A green body forming step, that is, ITO ceramic slurry is shaped by pressure grouting to obtain an ITO ceramic green body, and the relative density of the green body is not less than 62%. The relative density of the ITO ceramic target green body is one of the important parameters for controlling the densification degree of its final product ITO target. The relative density of the green body is controlled at 62% or more to obtain an ITO ceramic target with high degree of densification;

A green body integrated degreasing and sintering step, that is, the ITO ceramic green body undergoes an integrated degreasing and sintering treatment to obtain an ITO ceramic target; wherein, the integrated degreasing and sintering treatment specifically includes: putting the ITO ceramic green body into a degreasing and sintering integrated furnace; heating the degreasing and sintering integrated furnace to a degreasing temperature of 700~800° C. and degreasing the ITO ceramic target in an atmospheric oxygen atmosphere with a degreasing time set to 12~36 hours; after the degreasing process is complete, increasing the temperature of the degreasing and sintering integrated furnace from the degreasing temperature to the first sintering temperature of 1,600~1,650° C.; after heating up to the first sintering temperature, keep temperature at this sintering temperature for 0~60 min, then starting to reduce from the first sintering temperature to the second sintering temperature of 1,500~1,540° C., and performing the sintering treatment at the second sintering temperature in the atmospheric oxygen atmosphere with the temperature kept for 12~36 hours, to finally obtain an ITO ceramic target.

In some embodiments, the mass fraction of $In_2O_3$ powder is 90, 93, 95 or 97, and correspondingly, the mass fraction of $SnO_2$ powder is 10, 7, 5 or 3 respectively, so the sum of mass fractions of the two is 100.

In some embodiments, the primary particle size distribution of $In_2O_3$ powder and $SnO_2$ powder ranges from 80~200 nm.

In the slurry preparation step of some embodiments, two oxide powders of $In_2O_3$ and $SnO_2$ are mixed with deionized water, diluent, binder and polymer material to prepare an ITO slurry with high solid content and low viscosity; wherein the diluent includes polyacrylic or polycarboxylic acid diluent, the binder includes gum arabic, polyvinyl alcohol or acrylic resin, and the polymer material includes polyacrylamide.

In the slurry preparation of some embodiments, $In_2O_3$ powder and $SnO_2$ powder are ball-milled and mixed with deionized water, diluent, binder and polymer material by a sand mill in a negative pressure environment, with the negative pressure not greater than 9 Pa. Mixing powder materials with a sand mill can improve production efficiency on one hand, and on the other hand, short-term ball milling can greatly reduce zirconium impurities incorporated into the ITO slurry due to zirconia ball milling. As an alternative embodiment, pre-mixing ball milling can be performed before the ball milling of the sand mill. For example, ball-mill pre-mixing is performed in a roller ball-milling tank.

Generally, the solid content of the ITO slurry after ball milling and mixing has a fairly large influence on the target body shaping or forming. Experiments show that it is more suitable to control the solid content between 70~80%. The slurry of lower than 70% will render formation difficult due to moisture content too high, and the green body is easy to crack. The slurry of higher than 80% is not easy to obtain, which affects the stability of the process of material preparation.

Generally, it is more appropriate to control the average particle size D50 of the ITO slurry after ball milling and mixing between 200~300 nm. The average particle size less than 200 nm will cause delamination in subsequent formation, which will cause the quality of the ITO green body to decline and cause the green body to difficulty form and easily crack. With the average particle size higher than 300 nm, the powder has micro-agglomeration, and the powder activity is not enough so that the sintering cannot be fully densified.

Generally, the viscosity of the ITO slurry after ball milling and mixing has an effect on the forming of the target body. Experiments show that the ITO ceramic slurry with the viscosity controlled between 120~300 mpa·s is conducive to the formation of the target. The slurry with the viscosity lower than 120 mpa·s is difficult to form into a target material by grouting, whereas the slurry with the viscosity higher than 300 mpa·s deteriorates in the rheological property, and increase in the grouting difficulty, so that it is not easy to form a target body.

Generally, the oxide slurry is ball-milled under negative pressure. On one hand, it can reduce the introduction of air and impurities into the slurry during the ball milling, and on the other hand, it can eliminate the process of vacuum defoaming the slurry after the ball milling, thereby reducing equipment and time costs and increasing production efficiency. The negative pressure disclosed in the embodiments of this application is not greater than 9 Pa, which can achieve the above technical effects.

In some embodiments, the method of preparing an ITO ceramic target with a controllable grain size includes a green body forming step, in which the ITO slurry is formed into an ITO ceramic green body.

In some embodiments, the obtained ITO slurry is shaped or cast by a pressure grouting process. For example, it is injected into a mold such as a plaster mold under a specific pressure to form a green body. Usually the relative density of the ITO green body is controlled between 58~62%. The relative density being lower than 58% makes the sintered ceramic material unable to be densified and unable to effectively control the grain size, while the relative density being higher than 62% does not significantly improve the sintering effect of the final product, but increases the production cost.

In some embodiments, the method of preparing an ITO ceramic target with a controlled grain size includes an integrated degreasing and sintering step. The integrated degreasing and sintering step usually refers to the degreasing process of the ITO target body at a certain temperature. After the degreasing process is completed, the temperature is directly increased from the degreasing temperature to the sintering temperature, and the sintering process is carried out. The degreasing and sintering processes are continuously performed in the same device to shorten the preparation time of the target material, and at the same time avoid the structural damage to the target material caused in the process of changing the preparation equipment or environment, which damage will affect the performance of the product. Generally, the degreasing and sintering process of the ITO target is carried out in an integrated furnace with an atmospheric oxygen atmosphere. The process is simple, avoiding the reduction of sintering activity of the ceramic surface, which is good for obtaining a ceramic target with a high degree of densification.

As an alternative embodiment, the ITO ceramic green body is usually degreased at a certain temperature. For example, the degreasing temperature selected in some embodiments is between 700~800° C.

As an alternative embodiment, usually the degreased ITO ceramic green body is sintered at a higher temperature to obtain a ceramic target. In some embodiments, the ITO ceramic target body is first heated up to a first sintering temperature of 1,600~1,650° C., then the temperature is lowered to a second sintering temperature of 1,500~1,540° C., and the temperature is kept at the second sintering temperature for 12~36 hours. The sintering process is usually carried out in an atmospheric high-purity oxygen atmosphere.

As an alternative embodiment, usually the degreased ITO ceramic green body is sintered at a higher temperature to obtain a ceramic target. In some embodiments, the ITO ceramic target body is first heated up to a first sintering temperature of 1,600~1,650° C., and is held at the first sintering temperature for no more than 60 minutes. Then the temperature is lowered to a second sintering temperature of 1,500~1,540° C., and the temperature is kept at the second sintering temperature for 12~36 hours. The sintering process is usually carried out in an atmospheric high-purity oxygen atmosphere.

In the integrated degreasing and sintering step of some embodiments, the rate of temperature increase from the room temperature to the degreasing temperature is set at 1~3° C./min. Controlling the heating rate of the degreasing temperature is conducive to controlling the sintering effect of the target material, and is beneficial to obtain a ceramic target with a high density, a low resistivity, and fine and uniform grains. The heating rate being controlled at 1~3° C./min is a more preferred embodiment.

In the integrated degreasing and sintering step of some embodiments, the rate of temperature increase from the degreasing temperature to the first sintering temperature is set to 2~5° C./min. Controlling the heating rate of the first sintering temperature is conducive to controlling the sintering effect of the target, and is beneficial to obtain a ceramic target with a high density, a low resistivity, and fine and uniform grains. The heating rate being set to 2~5° C./min is a more preferred embodiment.

In the integrated degreasing and sintering step of some embodiments, the rate of temperature decrease from the first sintering temperature to the second sintering temperature is set to 8~16° C./min. Controlling the cooling rate of the second sintering temperature is conducive to controlling the sintering effect of the target, and is beneficial to obtain a ceramic target with a high density, a low resistivity, and fine and uniform grains. The cooling rate being set to 8~16° C./min is a more preferred embodiment.

The implementation details of the method of preparing an ITO ceramic target with a controllable grain size are further described below in combination with specific embodiments.

Embodiment 1

The method of preparing an ITO ceramic target with a controllable grain size in this embodiment 1 includes the following actions to:

Weigh 450 g of $In_2O_3$ powder and 50 g of $SnO_2$ powder respectively; 9 g of polyacrylic acid, 2.5 g of gum arabic, 9 g of acrylamide and 125 g of deionized water to form a pre-mixed liquid;

Add the two oxide powders and the pre-mixed liquid to a roller ball-mill tank to be mixed and ball-milled for 1 hour, and then move the slurry to a sand mill for high energy ball-milling, with the vacuum degree of the ball-mill tank pumped to 9 Pa, to obtain an ITO slurry with a powder solid mass content of 80%, in which the average particle size distribution D50 of the mixed powder measured by the laser grain analyzer is 200 nm;

Inject the slurry into a plaster mold, and shape it under a pressure of 0.2 MPa to obtain an ITO ceramic green body with a relative density of 62%;

Dry the ITO ceramic green body, and then put it into a degreasing and sintering integrated furnace under the degreasing temperature of 750° C. for the time of 24 hours; after the degreasing is completed, directly raise to the first sintering temperature of 1,640° C. at a heating rate of 3° C./min, hold at the first sintering temperature for 30 minutes, then reduce the temperature at a rate of 16° C./min to the second sintering temperature of 1,540° C., and hold at the second sintering temperature for 36 hours, with the sintering atmosphere of atmospheric high-purity oxygen.

The ITO ceramic target obtained in the embodiment 1 has a relative density of 99.7% and a resistivity of 0.13 mΩ·m. Its microstructure morphology is shown in FIG. 1. The inside of the ceramic is completely densified and the grain distribution is uniform. The average size of the grains is 12.3 μm.

Embodiment 2

The method of preparing an ITO ceramic target with a controllable grain size in this embodiment 2 includes the following actions to:

Weigh 450 g of $In_2O_3$ powder and 50 g of $SnO_2$ powder respectively; 9 g of polyacrylic acid, 2.5 g of gum arabic, 9 g of acrylamide and 125 g of deionized water to form a pre-mixed liquid;

Add the two oxide powders and the pre-mixed liquid to a roller ball-mill tank to be mixed and ball-milled for 1 hour, and then move the slurry to a sand mill for high energy ball-milling, with the vacuum degree of the ball-mill tank pumped to 9 Pa, to obtain an ITO slurry with a powder solid mass content of 80%, in which the average particle size distribution D50 of the mixed powder measured by the laser grain analyzer is 200 nm;

Inject the slurry into a plaster mold, and shape it under a pressure of 0.2 MPa to obtain an ITO ceramic green body with a relative density of 62%;

Dry the ITO ceramic green body, and then put it into a degreasing and sintering integrated furnace under the degreasing temperature of 750° C. for the time of 24 hours; after the degreasing is completed, directly raise to the first sintering temperature of 1,640° C. at a heating rate of 3° C./min, then reduce the temperature at a rate of 16° C./min to the second sintering temperature T2 of 1,540° C., and hold at the sintering temperature T2 for 24 hours, with the sintering atmosphere of atmospheric high-purity oxygen.

Figure 2:
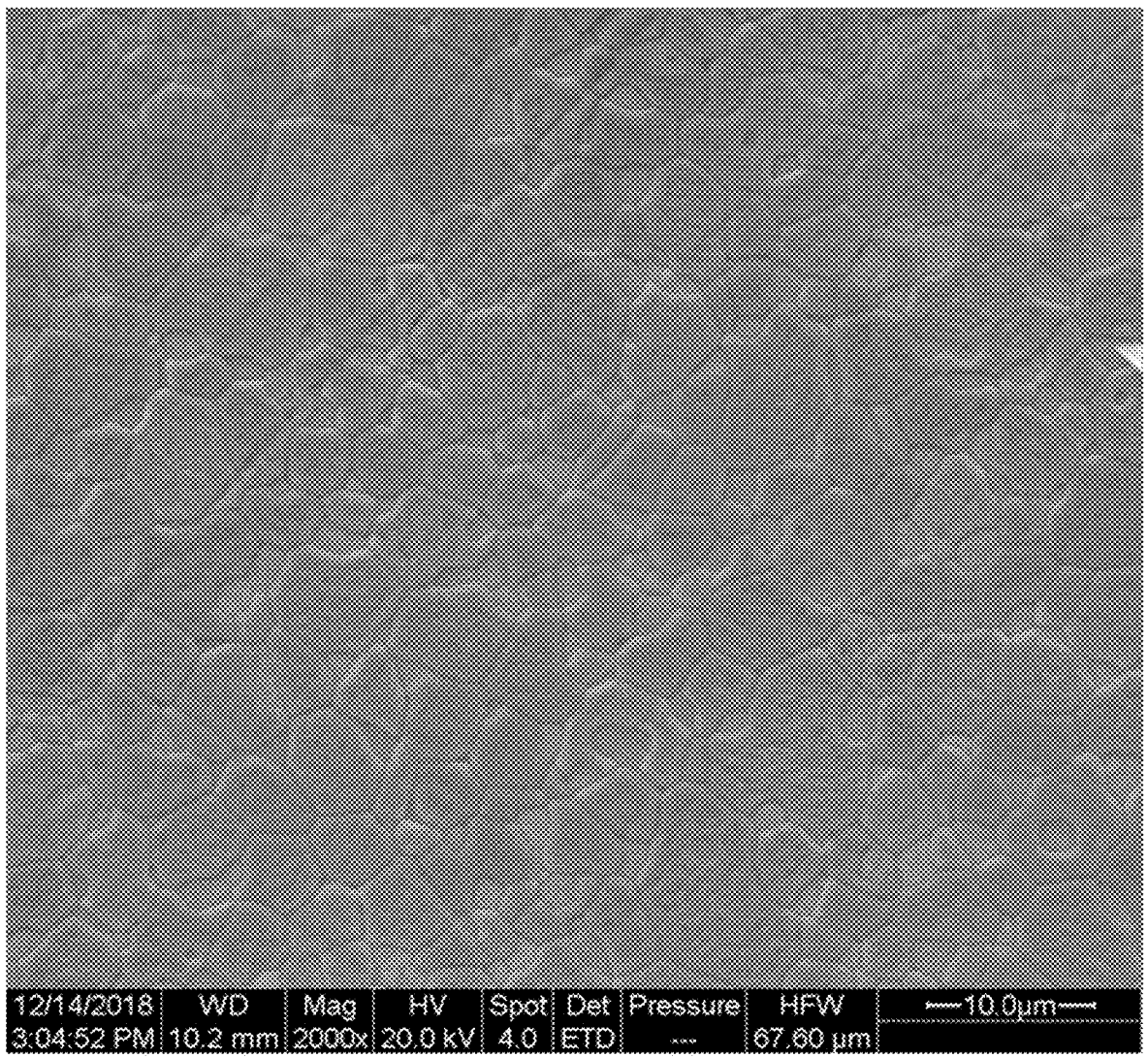
FIG. 2 is a scanning electron micrograph of the ITO ceramic target in embodiment 2.

The ITO ceramic target obtained in the embodiment 2 has a relative density of 99.5% and a resistivity of 0.14 mΩ·m. Its microstructure morphology is shown in FIG. 2, completely densifying its average size of grains to 5.6 μm.

Embodiment 3

The method of preparing an ITO ceramic target with a controllable grain size in this embodiment 3 includes the following actions to:

Weigh 450 g of $In_2O_3$ powder and 50 g of $SnO_2$ powder respectively; 9 g of polyacrylic acid, 2.5 g of gum arabic, 9 g of acrylamide and 125 g of deionized water to form a pre-mixed liquid;

Add the two oxide powders and the pre-mixed liquid to a roller ball-mill tank to be mixed and ball-milled for 1 hour, then move the slurry to a sand mill for high energy ball-milling, with the vacuum degree of the ball-mill tank pumped to 9 Pa, to obtain an ITO slurry with a powder solid mass content of 80%, in which the average particle size distribution D50 of the mixed powder measured by the laser grain analyzer is 200 nm;

Inject the slurry into a plaster mold, and shape it under a pressure of 0.2 MPa to obtain an ITO ceramic green body with a relative density of 62%;

Dry the ITO ceramic green body, and then put it into a degreasing and sintering integrated furnace under the degreasing temperature of 750° C. for the time of 24 hours; after the degreasing is completed, directly raise to the first sintering temperature of 1,600° C. at a heating rate of 3° C./min, then reduce the temperature at a rate of 16° C./min to the second sintering temperature of 1,540° C., and hold at the second sintering temperature for 24 hours, with the sintering atmosphere of atmospheric high-purity oxygen.

Figure 3:
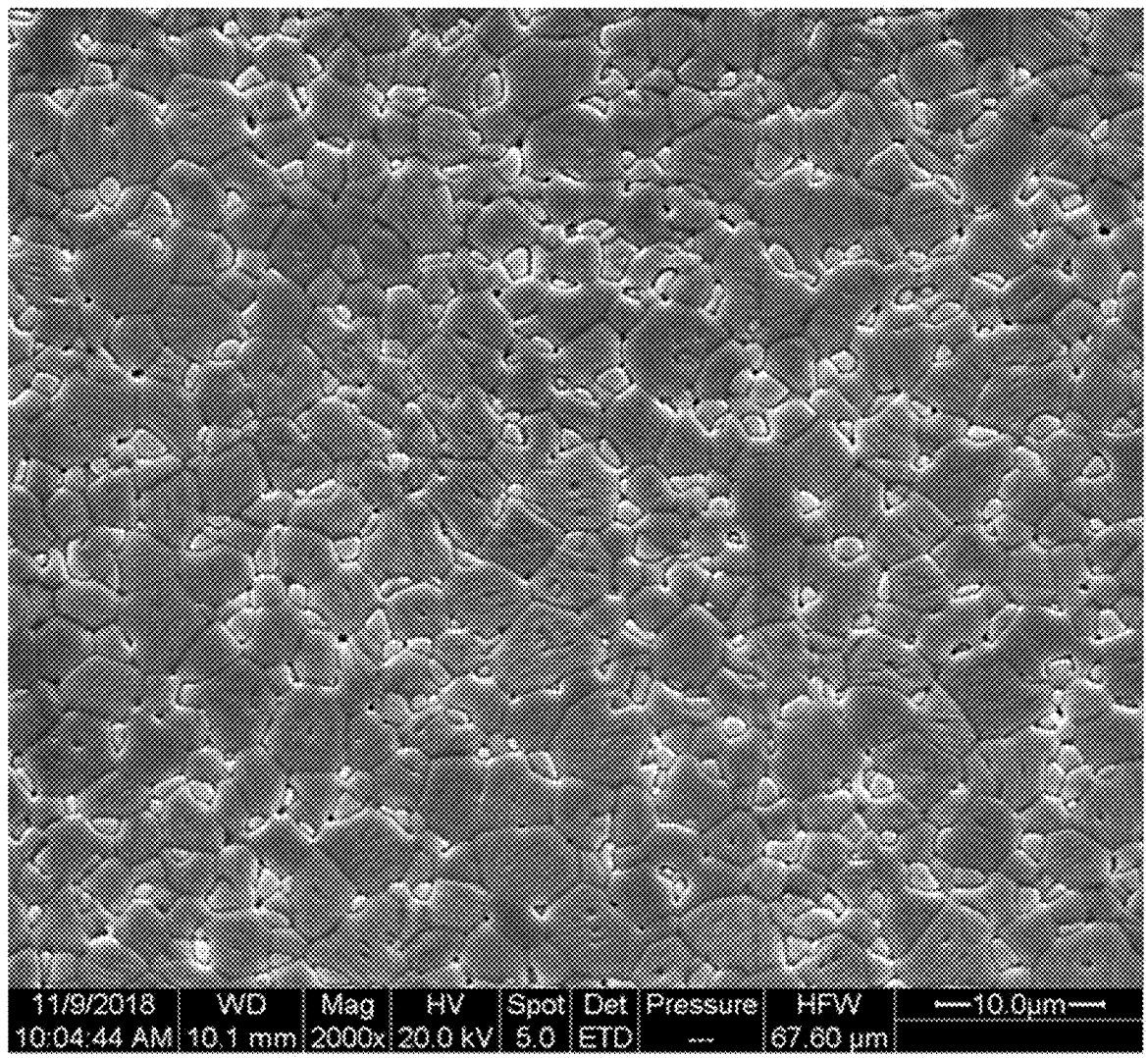
FIG. 3 is a scanning electron micrograph of the ITO ceramic target in embodiment 3.

The ITO ceramic target obtained in the embodiment 3 has a relative density of 99.6% and a resistivity of 0.15 mom. Its microstructure morphology is shown in FIG. 3, completely densifying its average size of grains to 3.8 μm.

Comparative Example 1

The method of preparing an ITO ceramic target with a controllable grain size in this comparative example 1 includes the following actions to:

Weigh 450 g of $In_2O_3$ powder and 50 g of $SnO_2$ powder respectively; 9 g of polyacrylic acid, 2.5 g of gum arabic, 9 g of acrylamide and 125 g of deionized water to form a pre-mixed liquid;

Add the oxide powders and the pre-mixed liquid to a roller ball-mill tank to be mixed and ball-milled for 1 hour, then move the slurry to a sand mill for high energy ball-milling, with the vacuum degree of the ball mill tank pumped to 9 Pa, to obtain an ITO slurry with a powder solid mass content of 80%, in which the average particle size distribution D50 of the mixed powder measured by the laser grain analyzer is 500 nm;

Inject the slurry into a plaster mold, and shape it under a pressure of 0.2 MPa to obtain an ITO ceramic green body with a relative density of 62%;

Dry the ITO ceramic green body, and then put it into a degreasing and sintering integrated furnace under the degreasing temperature of 750° C. for the time of 24 hours; after the degreasing is completed, directly raise to the maximum sintering temperature of 1,600° C. at a heating rate of 3° C./min, and then hold at this sintering temperature for 24 hours, with the sintering atmosphere of atmospheric high-purity oxygen.

Figure 4:
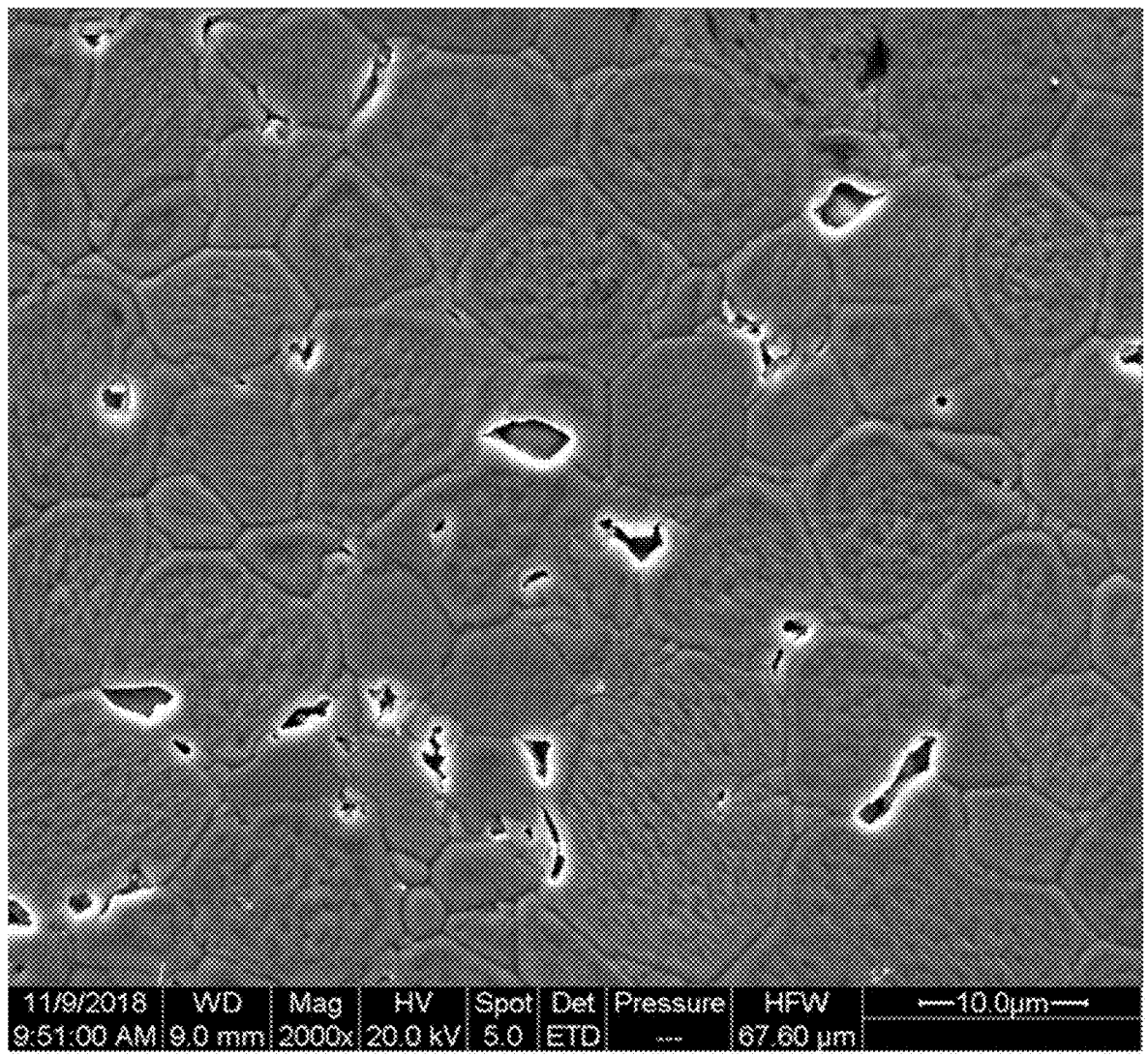
FIG. 4 is a scanning electron micrograph of the ITO ceramic target in comparative example 1.

The ITO ceramic target obtained in the comparative example 1 has a relative density of 97.4% and a resistivity of 0.19 mΩ·m. Its microstructure morphology is shown in FIG. 4, and the average grain size is 11.5 μm. The inside of the ceramic is not completely densified with a few holes still present, because the mixed powder is not treated thoroughly, and the sintering activity of the powder is not enough.

Comparative Example 2

The method of preparing an ITO ceramic target with a controllable grain size in this comparative example 2 includes the following actions to:

Weigh 450 g of $In_2O_3$ powder and 50 g of $SnO_2$ powder respectively; 9 g of polyacrylic acid, 2.5 g of gum arabic, 9 g of acrylamide and 125 g of deionized water to form a pre-mixed liquid;

Add the two oxide powders and the pre-mixed liquid to a roller ball-mill tank to be mixed, then move the slurry to a sand mill for high energy ball-milling for 1 hour with the vacuum degree of the ball-mill tank pumped to 9 Pa, to obtain an ITO slurry with a powder solid mass content of 80%, in which the average particle size distribution D50 of the mixed powder measured by the laser grain analyzer is 400 nm;

Inject the slurry into a plaster mold, and shape it under a pressure of 0.2 MPa to obtain an ITO ceramic green body with a relative density of 62%;

Dry the ITO ceramic green body, and then put it into a degreasing and sintering integrated furnace under the degreasing temperature of 750° C. for the time of 24 hours; after the degreasing is completed, directly raise to the maximum sintering temperature of 1,600° C. at a heating rate of 3° C./min, and then hold at this sintering temperature for 24 hours, with the sintering atmosphere of atmospheric high-purity oxygen.

Figure 5:
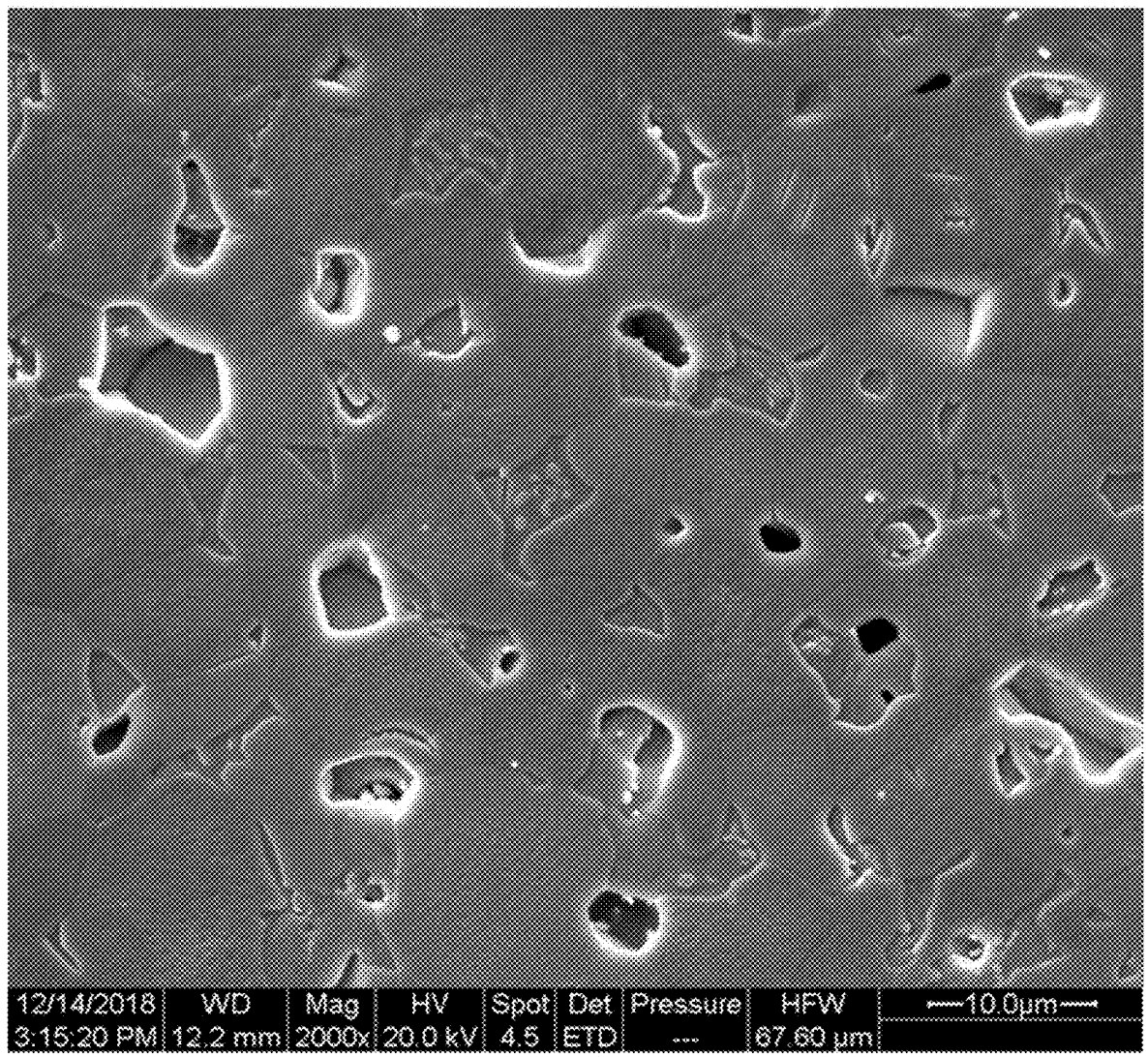
FIG. 5 is a scanning electron micrograph of the ITO ceramic target in comparative example 2.

The ITO ceramic target obtained in the comparative example 2 has a relative density of 97.8% and a resistivity of 0.18 mΩ·m. Its microstructure morphology is shown in FIG. 5, and the average grain size is 9.5 μm. The inside of the ceramic is not completely densified with a few holes still present, because the mixed powder is not treated thoroughly, and the sintering activity of the powder is not enough.

Comparative Example 3

The method of preparing an ITO ceramic target with a controllable grain size in this comparative example 3 includes the following actions to:

Weigh 450 g of $In_2O_3$ powder and 50 g of $SnO_2$ powder respectively; 9 g of polyacrylic acid, 2.5 g of gum arabic, 9 g of acrylamide and 125 g of deionized water to form a pre-mixed liquid;

Add the two oxide powders and the pre-mixed liquid to a roller ball-mill tank to be mixed and ball-milled for 1 hour, and then move the slurry to a sand mill for high energy ball-milling, with the vacuum degree of the ball mill tank pumped to 9 Pa, to obtain an ITO slurry with a powder solid mass content of 80%, in which the average particle size distribution D50 of the mixed powder measured by the laser grain analyzer is 200 nm;

Inject the slurry into a plaster mold, and shape it under a pressure of 0.05 MPa to obtain an ITO ceramic green body with a relative density of 57%;

Dry the ITO ceramic green body, and then put it into a degreasing and sintering integrated furnace under the degreasing temperature of 750° C. for the time of 24 hours;

after the degreasing is completed, directly raise to the maximum sintering temperature of 1,600° C. at a heating rate of 3° C./min, and then hold at this sintering temperature for 24 hours, with the sintering atmosphere of atmospheric high-purity oxygen.

Figure 6:
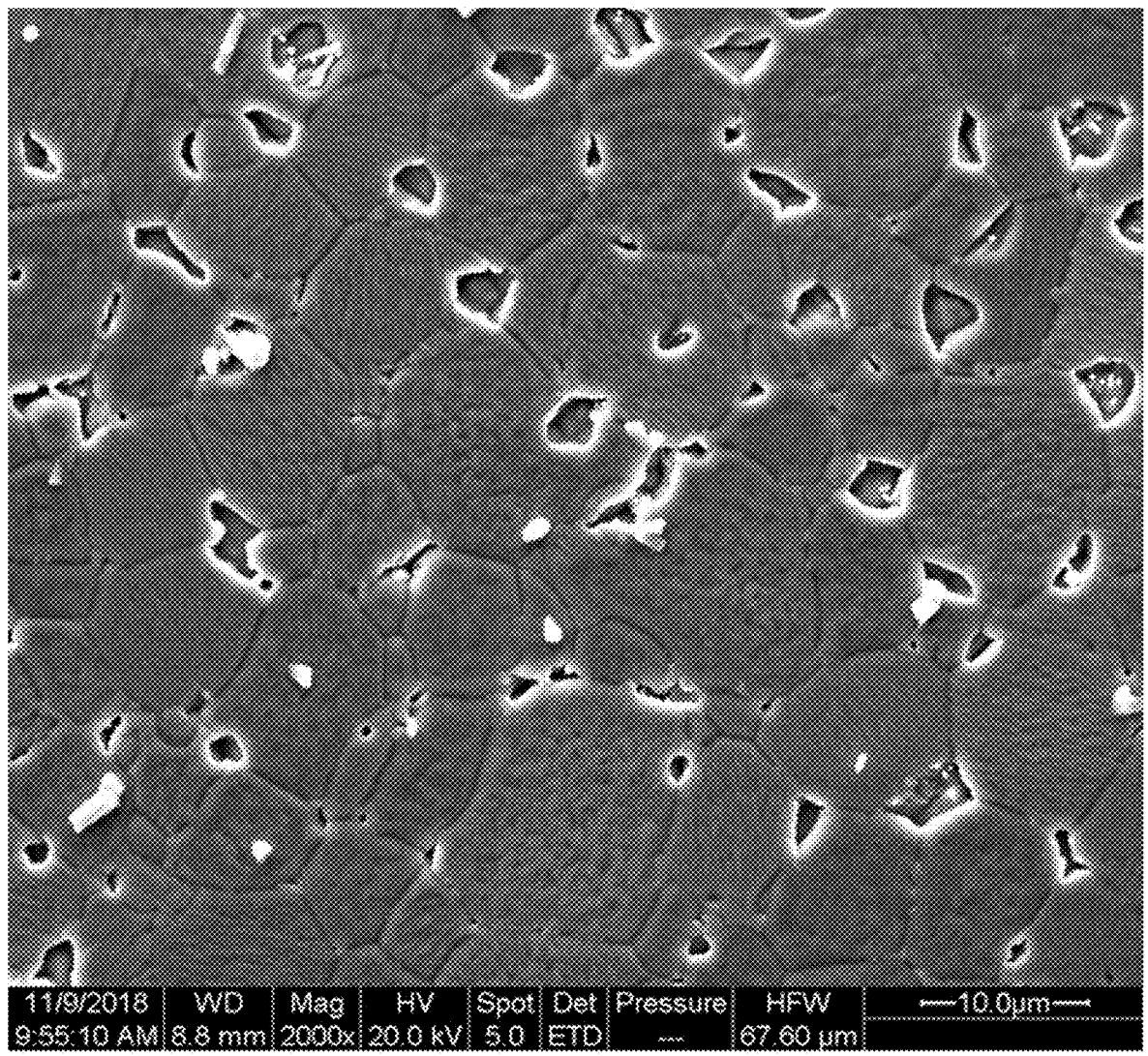
FIG. 6 is a scanning electron micrograph of the ITO ceramic target in comparative example 3.

The ITO ceramic target obtained in the comparative example 3 has a relative density of 98.2% and a resistivity of 0.17 mΩ·m. Its microstructure morphology is shown in FIG. 6, and the average grain size is 11.5 μm. The inside of the ceramic is not completely densified with a few holes still present, because the relative density of the ITO ceramic green body is not enough to meet the requirements of the sintering process.

Relative to the embodiments 1 to 3, the ITO ceramic targets obtained in the comparative examples 1 to 3 have a lower relative density and a higher electrical resistivity and have the sintered body not fully densified.

The method of preparing an ITO ceramic target with a controllable grain size disclosed by the embodiments of the present application conducts innovative research from such aspects as the primary particle size distribution of powder, ball-milled dispersion particle size distribution of the mixed powder, synergistically optimized combination of forming process and sintering process etc., and ITO ceramic target crystal structure. The prepared ITO ceramic target with a controlled grain size, achieves excellent electrical and mechanical properties, which are conducive to the preparation of high-quality ITO films. The process is easy to operate, the green body has a good sinterability, and it is convenient to prepare ITO ceramic targets of various sizes. The ITO ceramic targets have a high density, a low resistivity, fine grains, and uniform particle size distribution. Their relative density can reach 99.7%, the resistivity is as low as 0.13 mΩ·m, and the grain size can be controlled with the values thereof as low as 3~5 μm. The reduced sintering temperature can correspondingly reduce the production cost, extend the service life of the equipment, and is suitable for industrial production.

The technical details disclosed in the embodiments and the technical solutions disclosed by this application are merely illustrations of the concept of this application, and do not constitute limitations to the technical solutions of this application. Non-creative changes made to the technical details disclosed in this application all have the same inventive concept as this application, and all fall within the protection scope of the claims of this application.

The foregoing description of the exemplary embodiments of the present invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A method of preparing an ITO ceramic target with a controllable grain size, comprising:
   ball-milling and mixing $In_2O_3$ powder with mass fraction of 90~97 and $SnO_2$ powder with mass fraction of 10~3 with deionized water, diluent, binder and polymer material by a sand mill to obtain an ITO ceramic slurry with a solid content between 70~80% and a viscosity between 120~300 mPa·s, with an average particle size D50 of the mixed powder in the ITO ceramic slurry is controlled at 200~300 nm;
   shaping the ITO ceramic slurry by a pressure grouting to obtain an ITO ceramic green body with a relative density of 58~62%;
   the ITO ceramic green body undergoing an integrated degreasing and sintering treatment to obtain the ITO ceramic target; wherein the integrated degreasing and sintering treatment includes:
   putting the ITO green body into a degreasing and sintering integrated furnace;
   heating the degreasing and sintering integrated furnace to a degreasing temperature of 700~800° C., degreasing the ITO ceramic green body in an atmospheric oxygen atmosphere for a degreasing time set to 12 to 36 hours;
   increasing the degreasing and sintering integrated furnace from the degreasing temperature to a first sintering temperature of 1,600~1,650° C.; and
   after increasing to the first sintering temperature, keeping the temperature at the first sintering temperature for 0~60 min, then start to reduce the degreasing and sintering integrated furnace from the first sintering temperature to a second sintering temperature of 1,500~1,540° C., and sintering the ITO target at the second sintering temperature in the atmospheric oxygen atmosphere, with temperature kept for 12 to 36 hours, to finally obtain the ITO ceramic target.

2. The method according to claim 1, wherein the mass fractions of $In_2O_3$ powder and $SnO_2$ powder are 90 and 10.

3. The method according to claim 1, wherein the mass fractions of $In_2O_3$ powder and $SnO_2$ powder are 95 and 5.

4. The method according to claim 1, wherein the mass fractions of $In_2O_3$ powder and $SnO_2$ powder are 93 and 7.

5. The method according to claim 1, wherein a primary particle size distribution range of the $In_2O_3$ powder is 80~200 nm, and a primary particle size distribution range of the $SnO_2$ powder is 80~200 nm.

6. The method according to claim 1, wherein the diluent includes polyacrylic or polycarboxylic acid diluent, the binder includes gum arabic, polyvinyl alcohol or acrylic resin, and the polymer material includes polyacrylamide.

7. The method according to claim 1, wherein said ball-milling and mixing is performed under vacuum depressurized conditions, the negative pressure not greater than 9 Pa.

8. The method according to claim 1, wherein a heating rate from a room temperature to the degreasing temperature is set to 1~3° C./min.

9. The method according to claim 1, wherein a heating rate from the degreasing temperature to the first sintering temperature is set to 2~5° C./min.

10. The method according to claim 1, wherein a cooling rate from the first sintering temperature to the second sintering temperature is set to 8~16° C./min.

\* \* \* \* \*